(12) United States Patent
Burt et al.

(10) Patent No.: US 6,768,318 B2
(45) Date of Patent: Jul. 27, 2004

(54) SIGNAL CONDITIONING CIRCUIT FOR RESISTIVE SENSORS

(75) Inventors: Rodney T. Burt, Tucson, AZ (US); Thomas L. Botker, Tucson, AZ (US); John M. Brown, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/211,794

(22) Filed: Aug. 2, 2002

(65) Prior Publication Data

US 2002/0190734 A1 Dec. 19, 2002

Related U.S. Application Data

(63) Continuation-in-part of application No. 09/790,951, filed on Feb. 22, 2001, now Pat. No. 6,538,503.

(51) Int. Cl.[7] .............................................. G01R 27/28
(52) U.S. Cl. ........................ 324/651; 324/691; 324/525
(58) Field of Search ................................ 324/525, 526, 324/549, 691, 651, 451; 73/862, 628; 374/183, 185; 338/25

(56) References Cited

U.S. PATENT DOCUMENTS

| | | | |
|---|---|---|---|
| 4,232,271 A | 11/1980 | Dobkin et al. | 330/258 |
| 4,833,422 A | 5/1989 | Atwell | 330/254 |
| 5,075,633 A | 12/1991 | Bowers | 330/69 |
| 5,276,405 A | 1/1994 | Mazzucco et al. | 330/257 |

OTHER PUBLICATIONS

"Novel Current–Mode Instrumentation Amplifier," Electronics Letters, Feb. 2, 1989, vol. 25, No. 3, pp 228–230, Feb. 1989.
"Low Noise, Precision Instrumentation Amplifier," Analog Devices, inc., 1998, pp 1–22, no month available.

*Primary Examiner*—N. Le
*Assistant Examiner*—Vincent Q. Nguyen
(74) *Attorney, Agent, or Firm*—W. Daniel Swayze, Jr.; W. James Brady; Frederick J. Telecky, Jr.

(57) ABSTRACT

A circuit is provided that can provide, in a single package, a circuit to monitor a sensing element which uses a variable resistor. The circuit (also known as a signal conditioning circuit) may contain resistor input terminals to which a reference set resistor and a resistive sensor can be attached. A reference voltage signal can be applied to both terminals. There are also a circuit for sensing the resulting current flowing through both the set resistor and the resistive sensor. The difference of the currents flowing through each element can then be monitored as being indicative of the difference in resistance between the set resistor and the resistive sensor. The current difference signal can be used to generate a voltage difference signal indicative of the difference in resistance between the set resistor and the resistive sensor. The signal conditioning circuit may be used to adjust the temperature of various devices.

32 Claims, 3 Drawing Sheets

SIGNAL CONDITIONING CIRCUIT FOR RESISTIVE SENSORS

CROSS-REFERENCE TO RELATED APPLICATIONS

This application is a continuation-in-part of U.S. patent application Ser. No. 09/790,951, entitled "Instrumentation Amplifier," filed Feb. 22, 2001 now U.S. Pat. No. 6,538,503.

FIELD OF INVENTION

The present invention relates to electronic circuits. More particularly, the present invention relates to a signal conditioning circuit for determining the resistance of resistive sensors, including thermistors.

BACKGROUND OF THE INVENTION

There are types of resistors that have a resistance characteristic that varies with respect to changes to a certain property. The resistance can then be used to measure that property. For example, a thermistor has a resistance that varies with temperature. Thus, the thermistor can be used to measure temperature by measuring the resistance of the thermistor. There are other types of resistors available that are sensitive to different variables, such as pressure or light.

One prior art system for measuring a resistance is illustrated in circuit 100 of FIG. 1. Circuit 100 features an excitation circuit and an amplifier section. The excitation circuit is configured to excite a resistive sensor and a reference resistor, while the amplifier is configured to output a result that is proportional to the difference in resistance between the reference resistance and the resistance of the sensor.

The excitation circuit comprises a voltage source 102, a resistor 110 and a resistor 112, a set resistor (or reference resistor) 114, and a resistive sensor, e.g., a thermistor 116. Resistors 110 and 112 may be identical in configuration, i.e., matched resistors, such that known biases are applied to set resistor 114 and thermistor 116. This bias of set resistor 114 creates a voltage that is propagated to an input terminal 125 of instrumentation amplifier 120. The current flowing across thermistor 116 creates a voltage that propagates to an input terminal 123 of instrumentation amplifier 120.

The amplification section comprises an instrumentation amplifier 120. Instrumentation amplifier 120 is typically configured as a differential amplifier that amplifies the difference in voltage between the voltage at input terminal 123 and the voltage at input terminal 125 and generates a signal at the output terminal 124 of instrumentation amplifier 120. This voltage difference is proportional to the difference in resistance between thermistor 116 and set resistor 114. A typical instrumentation amplifier may have a gain of approximately 100. Set resistor 114 has a known resistance, while the temperature/resistance characteristics of thermistor 116 and the gain of instrumentation amplifier 120 are also known. Due to these known characteristics, the temperature being sensed by thermistor 116 can be calculated. However, a significant drawback of circuit 100 is that it is important for resistors 110 and 112 to be matched to provide a known bias, often requiring expensive precision resistors to be included.

An alternative layout for a prior art circuit 400 of measuring a resistance is shown in FIG. 4, where the excitation of set resistor 414 and thermistor 416 is accomplished through the use of current sources 410 and 412, i.e., voltage source 102, and resistors 110 and 112 are replaced with current sources 410 and 412. However, there may be difficulty in matching current sources 410 and 412 to provide known, equal currents.

The measurement of temperature can be important in a variety of applications. For example, one use of thermistors is in the field of optical networking. An optical network system may use lasers to transmit light through a fiber optic cable. The lasers are typically kept at a predetermined temperature, in order to have the laser transmit light of a predetermined wavelength. One method that can be used to control the temperature is to use a thermoelectric cooler and a thermistor mounted on the laser diode. The thermistor will change in resistance when there is a change in temperature. The thermistor may be coupled to the thermoelectric cooler in such a way that the amount of cooling increases when the temperature becomes too high and decreases when the temperature lowers to a desired level. However, prior art measurements systems for such applications can be quite complex.

There is a desire for a simpler and more compact system and method for testing and/or measuring the resistance in resistive sensors. In addition, to determine the difference between a set resistor and a thermistor or other resistive sensor, it would be desirable to have the currents exciting the set resistor and the resistive sensor be as closely matched as possible, i.e., to minimize the difference in excitation sources, without requiring precision resistors, matched resistors, or the difficult matching of current sources.

SUMMARY OF THE INVENTION

The method and circuit according to the present invention addresses many of the shortcomings of the prior art. In accordance with one aspect of the present invention, a circuit is provided that can facilitate accurate resistance measurements.

In accordance with an exemplary embodiment of the present invention, a self-contained signal conditioning circuit can be provided that contains a mechanism for testing and/or measuring resistance in a resistive sensor by connecting the resistive sensor and a reference resistor, e.g., a set resistor, to the self-contained signal conditioning circuit. Such a signal conditioning circuit may contain an amplification stage coupled to the set resistor, with a similarly configured amplification stage coupled to the resistive sensor. The current being supplied to the set resistor and to the resistive sensor can be monitored and the difference between the amount of current being supplied to the set resistor and the amount of current being supplied to the resistive sensor can be sensed. This difference in current is proportional to the difference in resistance between the set resistor and the resistive sensor. This difference in current may be converted to a voltage signal, if so desired.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in a variety of integrated circuit applications. It should be noted that while various components may be suitably coupled or connected to other components within exemplary circuits, such connections and couplings can be realized by direct connection between components, or by connection through other components and devices.

As discussed above, prior art resistance measurement systems are more complex than desired. In accordance with various aspects of the present invention, a signal conditioning circuit that can facilitate accurate resistance measurements is provided.

In accordance with an exemplary embodiment of the present invention, a self-contained signal conditioning circuit is provided that contains a mechanism for testing and/or measuring resistance in a resistive sensor by connecting a resistive sensor and a reference resistor, e.g., a set resistor, to the self-contained signal conditioning circuit. Such a signal conditioning circuit may contain an amplification stage coupled to the set resistor, with a similarly configured amplification stage coupled to the resistive sensor. The current being supplied to the set resistor and to the resistive sensor can be monitored and the difference in amount of current can be sensed. This difference is proportional to the difference in resistance between the set resistor and the resistive sensor.

Figure 1:
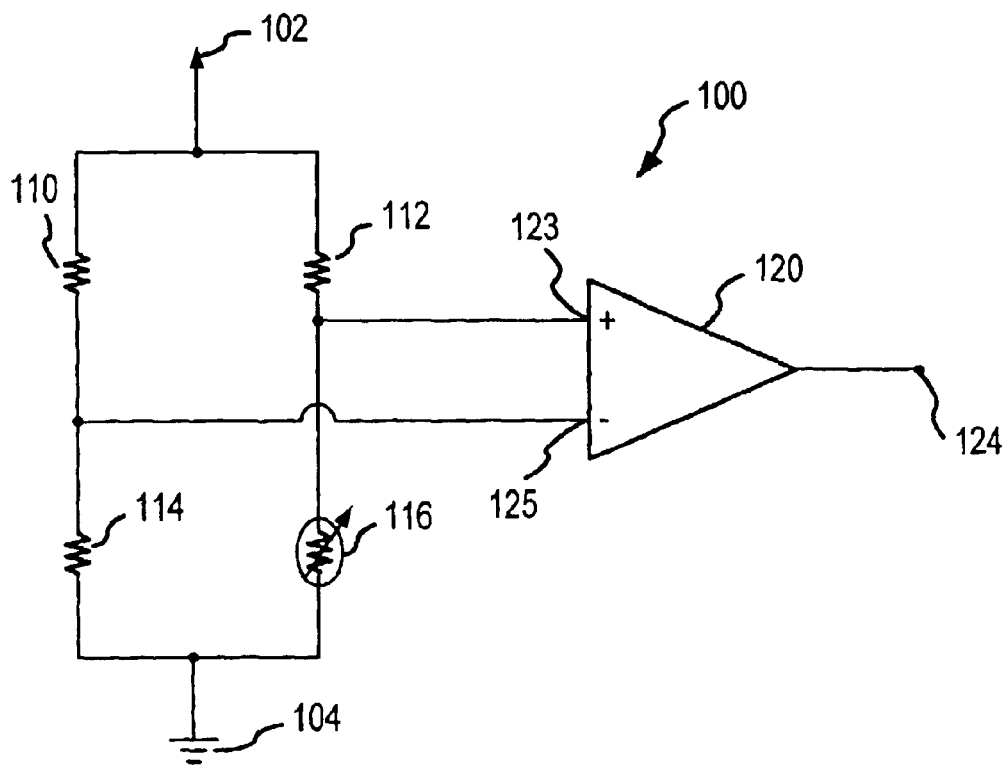
FIG. 1 illustrates a schematic diagram of a prior art system for measuring resistance.
Figure 2:
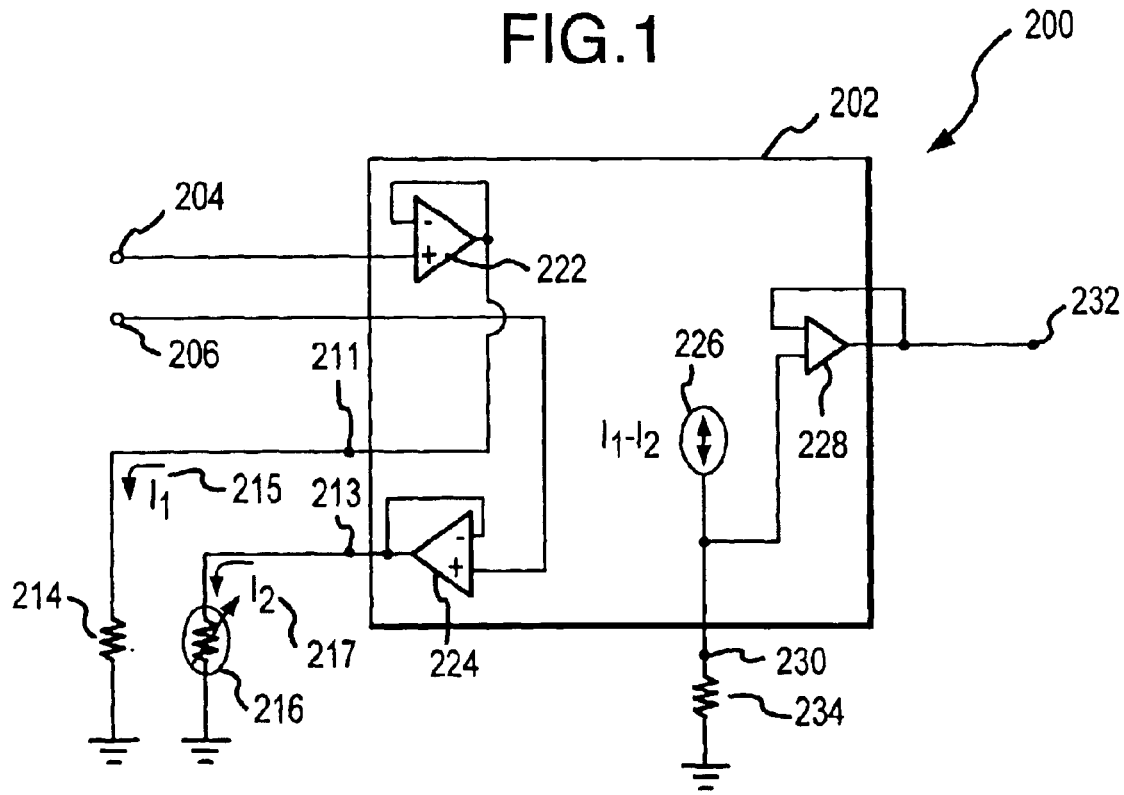
FIG. 2 illustrates a schematic diagram of an exemplary embodiment of the present invention for measuring resistance.

For example, an exemplary measurement system 200 is illustrated in FIG. 2. Measurement system 200 is generally configured as a self-contained circuit to measure the resistance of a resistive sensor, where the same circuit provides both excitation and measurement of the resistive sensor. System 200 comprises a signal conditioning circuit 202, to which can be attached a set resistor 214 and a thermistor 216.

Signal conditioning circuit 202 includes two voltage input terminals 204 and 206, and two output terminals 230 and 232. Voltage input terminals 204 and 206 can be coupled to a voltage supply or other power source to provide excitation to the resistors being tested. In one embodiment, output terminal 230 is configured to provide a current signal, to which can be attached a load resistor 234, and output terminal 232 is configured to provide a voltage signal. Terminals 211 and 213 can be used to connect a set resistor 214 and a thermistor 216, respectively.

Signal conditioning circuit 202 further comprises buffers 222 and 224. Buffers 222 and 224 can comprise various types of buffers, amplifiers or other like devices. Buffer 222 is coupled to voltage input terminal 204, while buffer 224 is coupled to voltage input terminal 206. Buffer 222 is configured to convert the voltage signal from voltage input terminal 204 to a current signal at terminal 211. In a similar manner, buffer 224 is configured to convert the voltage signal from voltage input terminal 206 to a current signal at terminal 213.

Between the input terminals and the output terminals, there is a device configured to sense the difference in the current flowing between a set resistor 214 and a thermistor 216. This sensed difference signal, as provided by the difference sensing device, is represented in FIG. 2 by a current source 226. The signal from current source 226 (indicative of the difference between the current flowing through set resistor 214 and the current flowing through thermistor 216) can be accessed directly via terminal 230. Alone or in addition, an amplifier 228 can be configured to provide a voltage signal based on current source 226 at output terminal 232.

After coupling a voltage source to voltage input terminals 204 and 206, and coupling set resistor 214 and resistive sensor 216 to system 200, the difference in resistance between set resistor 214 and resistive sensor 216 can be determined by monitoring the output signal at output terminal 230 or output terminal 232: the output signal is proportional to the difference in current flowing in set resistor 214 and thermistor 216, which is proportional to the difference in the resistance between set resistor 214 and resistive sensor 216.

Figure 3:
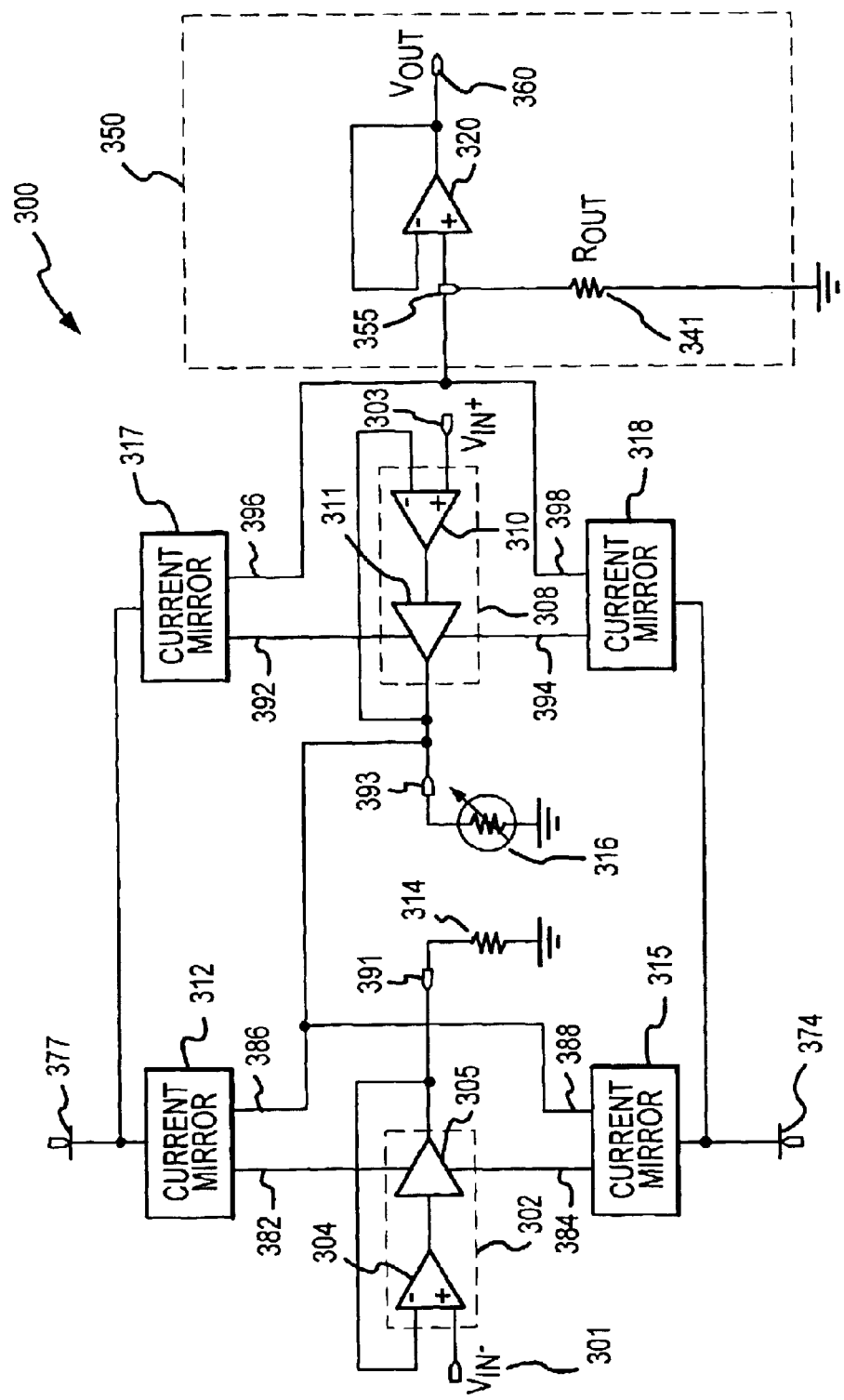
FIG. 3 illustrates a schematic diagram another exemplary embodiment of the present invention for measuring resistance.

A detailed schematic diagram of another exemplary embodiment of a measurement system 300 is presented in FIG. 3. System 300 comprises a voltage input circuit for application of voltage signals; input terminals for connecting a set resistor and a thermistor, a circuit for generating a differential current signal, and an output circuit. An example of operation for the various circuits and components can be found in U.S. application Ser. No. 09/790,951 now U.S. Pat. No. 6,538,503, entitled "Instrumentation Amplifier", having a common inventor and common assignee, and hereby incorporated by reference. The voltage input circuit comprises voltage input terminals 301 and 303 configured for connection to one or more voltage sources. It should be noted that terminal 303 and terminal 301 may also be coupled together such that they are driven by the same input voltage signal. An exemplary input voltage signal may be approximately 1.25 volts, however, other voltages can be utilized.

The voltage signal from terminal 301 propagates to a buffer 302 comprising an op-amp 304 and an output stage 305. In a similar manner, the voltage signal from terminal 303 propagates is connected to a buffer 308, comprising an op-amp 310 and an output stage 311.

As discussed more fully in U.S. application Ser. No. 09/790,951 now U.S. Pat. No. 6,538,503, buffers 302 and 308 can be configured to create a current-mode signal at terminals 391 and 393, respectively. These current-mode signals result from a voltage applied to a set resistor 314 and a thermistor 316. A difference sensing device comprising current mirrors 312, 315, 317, and 318 may be configured to supply bias current to output stages 305 and 311. Current mirrors 312 and 317 are coupled to a power supply 377 to generate the bias current. In a similar manner, current mirrors 315 and 318 are coupled to a power supply 374 to generate a bias current. The current that flows through set resistor 314, i.e., from output stage 305, can be sensed by determining the current flowing through current mirrors 312 and 315. More particularly, current mirrors 312 and 315 are coupled to output stage 305 through current mirror input terminals 382 and 384, respectively. Current mirror output terminals 386 and 388 are coupled to thermistor 316. Current mirrors 317 and 318 are coupled to output stage 311 via current mirror input terminals 392 and 394. Because output stage 311 is also coupled to current mirrors 312 and 315, as described above, current mirrors 317 and 318 are thus sensing, not only the current being supplied to thermistor 316, but also the current being supplied to set resistor 314. Current mirror output terminals 396 and 398 are then coupled to node 355. Because of the above-described configuration of current mirrors 312, 315, 317, and 318, the current signal present at node 355 is equal to the difference between the current flowing through set resistor 314 and the current flowing through thermistor 316. Such a signal can be through a buffer amplifier 320 to result in an output voltage at output terminal 360.

Figure 4:
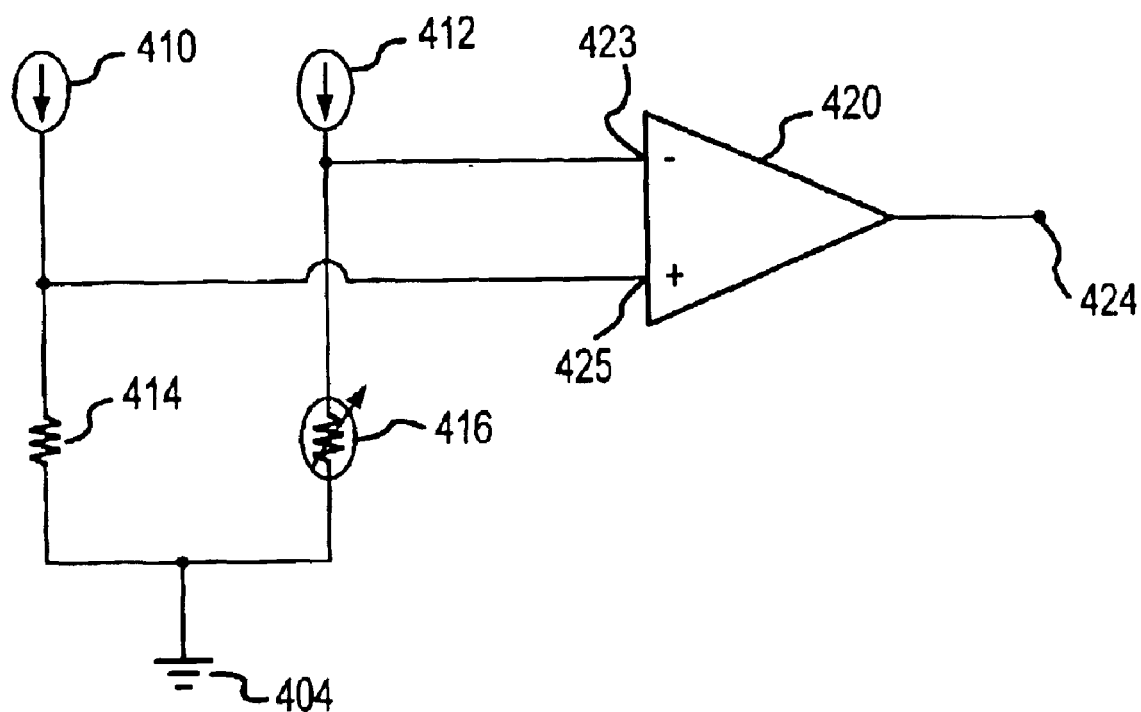
FIG. 4 illustrates a schematic diagram of another prior art system for measuring resistance.

In accordance with another exemplary embodiment, the difference current signal can be accessed at terminal 355 in various manners. One possible use of such a current signal would be to allow the connection of an output resistor 341 to produce an output voltage signal. Other embodiments can include the use of an adjustable reference, an output filtering configuration, or an offsetting output configuration, such as discussed more fully in U.S. application Ser. No. 09/790,951 with respect to FIGS. 4A–4C now U.S. Pat. No. 6,538,503.

Set resistor 314 can be attached to a terminal 391 and thermistor 316 can be attached to terminal 393. A reference voltage can be applied to input terminals 301 and 303. The same reference voltage can be applied to both input terminals 301 and 303. In another embodiment, different voltages can be applied, e.g., in a situation where the set resistance is very different from the resistance of the thermistor. For example, one may use a 10 kΩ set resistor and a thermistor that measures 10 kΩ in nominal conditions. When using such a configuration, it may be desirable to apply the same excitation voltage to input terminals 301 and 303. However, if one uses a 1 kΩ set resistor and a thermistor that is 10 kΩ in nominal conditions, it may be desirable to apply different voltages to input terminals 301 and 303.

The operation of circuit 300 begins by providing an excitation signal to set resistor 314 and thermistor 316. The excitation signal is provided by the connection of a voltage source to input terminals 301 and 303. The current flowing through both resistor 314 and thermistor 316 can then be compared with the difference in current being available at output terminal 355. Output terminal 355 can be accessed if a current signal is desired, while an output terminal 360 can be accessed if a voltage signal is desired.

In accordance with another aspect of the present invention, while buffers 302 and 308 can comprise various configurations, measurement system 300 may be suitably configured with chopper stabilized amplifiers for buffers 302 and 308 and/or for buffer 320, if desired. As a result, buffers 302 and 308 and/or output buffer 320 can be configured to address offset and drift errors. In accordance with this aspect of the present invention, the chopper-stabilized amplifiers can comprise any conventional chopper amplifier or any auto-zero configuration or dynamic element matching configuration and the like now known or hereinafter developed.

In addition, current mirrors 312 and 317, and current mirrors 315 and 318 may also be suitably configured to use chopper stabilization in accordance with various exemplary embodiments. For example, chopper stabilization may be suitably implemented to correct for various errors that may be present in the current mirrors. In addition, chopper stabilization may be implemented to reduce gain error and drifting problems, as well as improve the linearity of the current mirrors. Further, the chopper stabilized current mirrors can comprise any chopper stabilized, auto-zero, or dynamic element matching configuration and the like now known or hereinafter developed.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by providing other pin layouts or arrangements, and/or additional or fewer current mirrors. Further, while the invention has been described in reference to a thermistor, it should be understood that various forms of resistive sensors may also be used in various embodiments of this invention. In addition, the invention described above may also be used to measure any unknown resistance. In addition, for embodiments including chopper stabilized buffers or current mirrors, the devices can be configured to operate at various frequencies and other operating parameters. Moreover, the instrumentation amplifiers can be configured to aid the summation of multiple channels or for mixing, current-mode referencing, or signal processing applications and the like. These alternatives can be suitably selected depending upon the particular application or in consideration of any number of factors associated with the operation of the system. Moreover, these and other changes or modifications are intended to be included within the scope of the present invention, as expressed in the following claims.

We claim:

1. A circuit for measuring an unknown resistance, said circuit comprising:
   a first voltage input terminal and a second voltage input terminal;
   a first resistor input terminal and a second resistor input terminal;
   a first buffer having an input coupled to said first voltage input terminal and an output coupled to said first resistor input terminal;
   a second buffer having an input coupled to said second voltage input terminal and an output coupled to said second resistor input terminal; and
   a difference circuit configured to measure a difference in current between the current being supplied to said first resistor input terminal and the current being supplied to said second resistor input terminal, wherein,
      said difference in current is representative of a difference in resistance between a first resistance coupled to said first resistor input terminal and a second resistance coupled to said second resistor input terminal.

2. The circuit of claim 1 wherein
   said first buffer is configured to convert a voltage signal from said first voltage input terminal to a current signal at said first resistor input terminal; and
   said second buffer is configured to convert a voltage signal from said second voltage input terminal to a current signal at said second resistor input terminal.

3. The circuit of claim 1 wherein said difference circuit comprises:
   a first current mirror coupled to said first buffer; and
   a second current mirror coupled to said second buffer, wherein
      said first current mirror is further coupled to said second resistor input terminal;
      said first current mirror is configured to supply current to said first buffer;
      said second current mirror is configured to supply current to said second buffer; and an output of said second current mirror is configured to represent the difference in current being supplied to said first resistor input terminal and said second resistor input terminal.

4. The circuit of claim 3 wherein said difference circuit further comprises:
a third current mirror coupled to said first buffer; and
a fourth current mirror coupled to said second buffer, wherein
said third current mirror is further coupled to said first current mirror;
said fourth current mirror is further coupled to said second current mirror; and
an output from said second current mirror and said fourth current mirror represents a difference in current between difference in current between the current being supplied to said first resistor input terminal and the current being supplied to said second resistor input terminal.

5. The circuit of claim 4 wherein said difference circuit further comprises:
an amplifier coupled to said second and fourth current mirrors; wherein
said amplifier is configured to generate a voltage signal.

6. The circuit of claim 4 wherein each of said third current mirror and fourth current mirror are chopper stabilized.

7. The circuit of claim 4 wherein each of said third current mirror and fourth current mirror use dynamic element matching.

8. The circuit of claim 4 wherein each of said third current mirror and fourth current mirror use an auto-zero configuration.

9. The circuit of claim 3 wherein each of said first current mirror and second current mirror are chopper stabilized.

10. The circuit of claim 3 wherein each of said first current mirror and second current mirror use dynamic element matching.

11. The circuit of claim 3 wherein each of said first current mirror and second current mirror use an auto-zero configuration.

12. The circuit of claim 1 wherein said first buffer comprises:
a first input terminal;
a first output terminal;
a first amplifier comprising a second input terminal, a third input terminal, and a second output terminal; and
a second amplifier comprising a fourth input terminal and a third output terminal; wherein
the second output terminal of said first amplifier is coupled to the fourth input terminal of said second amplifier;
the third output terminal of said second amplifier is coupled to the second input terminal of said first amplifier and is further coupled to said first output terminal; and
the third input terminal of said first amplifier is coupled to said first input terminal.

13. The apparatus of claim 1 wherein said second buffer comprises:
a first input terminal;
a first output terminal;
a first amplifier comprising a second input terminal, a third input terminal, and a second output terminal; and
a second amplifier comprising a fourth input terminal and a third output terminal; wherein the second output terminal of said first amplifier is coupled to the fourth input terminal of said second amplifier;
the third output terminal of said second amplifier is coupled to the second input terminal of said first amplifier and is further coupled to said first output terminal; and
the third input terminal of said first amplifier is coupled to said first input terminal.

14. The circuit of claim 1, wherein each of said first buffer and said second buffer are chopper stabilized.

15. The circuit of claim 1, wherein each of said first buffer and said second buffer use an auto-zero configuration.

16. A method of comparing the resistance of a resistive sensor to a reference resistor with a known resistance, said method comprising:
applying a reference circuit to said resistive sensor and to said reference resistor to generate a current across said resistive sensor and said reference resistor;
measuring the current flowing across said resistive sensor and across said reference resistor; and
comparing the current flowing across said resistive sensor and the current flowing across said reference resistor; wherein,
said applying, measuring, and comparing steps are performed using a self-contained circuit,
wherein said comparing step comprises:
measuring a first current flowing across said resistive sensor;
measuring a second current flowing across said reference resistor; and
subtracting said first current from said second current to form a difference current.

17. The method of claim 16 further comprising:
converting said difference current into a voltage signal.

18. A signal conditioning circuit for determining a resistance of a resistive sensor, said signal conditioning circuit comprising:
a first voltage input terminal and a second voltage input terminal;
a first resistor input terminal and a second resistor input terminal; and
a difference circuit configured to measure a difference in current between the current being supplied to said first resistor input terminal and the current being supplied to said second resistor input terminal, wherein,
said difference in current is representative of a difference in resistance between a first resistance coupled to said first resistor input terminal and a second resistance coupled to said second resistor input terminal.

19. The signal conditioning circuit of claim 18 further comprising:
a first buffer having an input coupled to said first voltage input terminal and an output coupled to said first resistor input terminal; and
a second buffer having an input coupled to said second voltage input terminal and an output coupled to said second resistor input terminal.

20. The circuit of claim 19 wherein
said first buffer is configured to convert a voltage signal from said first voltage input terminal to a current signal at said first resistor input terminal; and
said second buffer is configured to convert a voltage signal from said second voltage input terminal to a current signal at said second resistor input terminal.

21. The circuit of claim 18 wherein said difference circuit comprises:
   a first current mirror coupled to said first buffer; and
   a second current mirror coupled to said second buffer, wherein
      said first current mirror is further coupled to said second resistor input terminal;
      said first current mirror is configured to supply current to said first buffer;
      said second current mirror is configured to supply current to said second buffer; and
      an output of said second current mirror is configured to represent the difference in current being supplied to said first resistor input terminal and said second resistor input terminal.

22. The circuit of claim 21 wherein said difference circuit further comprises:
   a third current mirror coupled to said first buffer; and
   a fourth current mirror coupled to said second buffer, wherein
      said third current mirror is further coupled to said first current mirror;
      said fourth current mirror is further coupled to said second current mirror; and
      an output from said second current mirror and said fourth current mirror represents a difference in current between the current being supplied to said first resistor input terminal and the current being supplied to said second resistor input terminal.

23. The circuit of claim 22 wherein said difference circuit further comprises:
   an amplifier coupled to said second and fourth current mirrors; wherein
      said amplifier is configured to generate a voltage signal.

24. The circuit of claim 22 wherein each of said third current mirror and fourth current mirror are chopper stabilized.

25. The circuit of claim 22 wherein each of said third current mirror and fourth current mirror use dynamic element matching.

26. The circuit of claim 22 wherein each of said third current mirror and fourth current mirror use an auto-zero configuration.

27. The circuit of claim 22 wherein each of said first current mirror and second current mirror are chopper stabilized.

28. The circuit of claim 22 wherein each of said first current mirror and second current mirror are use dynamic element matching.

29. The circuit of claim 22 wherein each of said first current mirror and second current mirror use an auto-zero configuration.

30. A system for measuring the resistance of a thermistor comprising:
   a reference resistor;
   an input voltage source; and
   a signal conditioning circuit coupled to said reference resistor, said thermistor, and said input voltage source, wherein
      said signal conditioning circuit configured to direct a signal from said input voltage source to said reference resistor and to said thermistor; and
      said signal conditioning circuit is further configured to measure a difference in current between the current being supplied to said thermistor and the current being supplied to said reference resistor.

31. The system of claim 30 wherein said signal conditioning circuit comprises:
   a first voltage input terminal and a second voltage input terminal;
   a first resistor input terminal and a second resistor input terminal; and
   a difference circuit configured to measure a difference in current between the current being supplied to said first resistor input terminal and the current being supplied to said second resistor input terminal, wherein,
      said difference in current is representative of a difference in resistance between a first resistance coupled to said first resistor input terminal and a second resistance coupled to said resistor input terminal.

32. The signal conditioning circuit of claim 31 further comprising:
   a first buffer having an input coupled to said first voltage input terminal and an output coupled to said resistor input terminal; and
   a second buffer having an input coupled to said second voltage input terminal and an output coupled to said second resistor input terminal.

* * * * *